(12) United States Patent
Wirth et al.

(10) Patent No.: US 6,511,914 B2
(45) Date of Patent: Jan. 28, 2003

(54) REACTOR FOR PROCESSING A WORKPIECE USING SONIC ENERGY

(75) Inventors: Paul Z. Wirth, Whitefish, MT (US); Steven L. Peace, Whitefish, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/907,524

(22) Filed: Jul. 16, 2001

(65) Prior Publication Data
US 2002/0020430 A1 Feb. 21, 2002

Related U.S. Application Data

(63) Continuation-in-part of application No. 09/437,711, filed on Nov. 10, 1999, which is a continuation-in-part of application No. PCT/US99/05676, filed on Mar. 15, 1999.
(60) Provisional application No. 60/116,750, filed on Jan. 22, 1999.

(51) Int. Cl.$^7$ ............................................. H01L 21/311
(52) U.S. Cl. .................. 438/694; 438/691; 438/782; 438/913; 269/20; 269/21; 156/345; 134/153; 134/157
(58) Field of Search ................. 438/694, 782, 438/913, 691, 704; 269/20–21; 156/345; 118/715, 620; 134/153–57

(56) References Cited

U.S. PATENT DOCUMENTS

| 3,656,671 A | * | 4/1972 | Bratek ............................. 225/1 |
| 3,727,620 A | | 4/1973 | Orr |
| 3,953,265 A | | 4/1976 | Hood |
| 4,132,567 A | | 1/1979 | Blackwood |
| 4,439,243 A | | 3/1984 | Titus |
| 4,439,244 A | | 3/1984 | Allevato |
| 4,544,446 A | * | 10/1985 | Cady |
| 4,664,133 A | | 5/1987 | Silvernail et al. |
| 4,750,505 A | | 6/1988 | Inuta et al. |
| 4,790,262 A | | 12/1988 | Nakayama et al. |
| 4,838,289 A | | 6/1989 | Kottman et al. |
| 4,903,717 A | | 2/1990 | Sumnitsch |
| 4,982,215 A | | 1/1991 | Maksuoka |
| 4,982,753 A | | 1/1991 | Grebinski, Jr. et al. |
| 5,020,200 A | | 6/1991 | Mimasaka |
| 5,032,217 A | | 7/1991 | Tanaka |

(List continued on next page.)

FOREIGN PATENT DOCUMENTS

| JP | 59-208831 | | 11/1984 | |
| JP | 60-137016 | | 7/1985 | |
| JP | 61-196534 | | 8/1986 | |
| JP | 62-166515 | | 7/1987 | |
| JP | 63-185029 | | 7/1988 | |
| JP | 1-120023 | | 5/1989 | |
| JP | 3-218016 | * | 9/1991 | .................. 21/304 |
| JP | 4 94537 | | 3/1992 | |
| JP | 5-13322 | | 1/1993 | |
| JP | 5-21332 | | 1/1993 | |
| JP | 5-326483 | | 12/1993 | |
| JP | 6-45302 | | 2/1994 | |
| JP | 52-12576 | | 1/1997 | |
| JP | 11-260778 | * | 9/1999 | .................. 21/304 |
| JP | 1-283845 | | 11/1999 | |
| JP | 2000-334403 | * | 12/2000 | .................. 21/304 |

*Primary Examiner*—Matthew Smith
*Assistant Examiner*—Granvill D Lee, Jr.
(74) *Attorney, Agent, or Firm*—Perkins Coie LLP

(57) ABSTRACT

A system for processing a workpiece includes a base having a bowl or recess for holding a liquid. A sonic energy source, such as a megasonic transducer, provides sonic energy into a liquid in the bowl. A process reactor or head holds a workpiece between an upper rotor and a lower rotor. A head lifter lowers the head holding the workpiece into the liquid. Sonic energy is provided to the workpiece through the liquid, optionally while the head spins the workpiece. The liquid may include de-ionized water and an etchant.

29 Claims, 2 Drawing Sheets

U.S. PATENT DOCUMENTS

| | | |
|---|---|---|
| 5,117,769 A | 6/1992 | DeBoer |
| 5,168,886 A | 12/1992 | Thompson et al. |
| 5,209,180 A | 5/1993 | Shoda et al. |
| 5,222,310 A | 6/1993 | Thompson et al. |
| 5,224,503 A | 7/1993 | Thompson et al. |
| 5,224,504 A | 7/1993 | Thompson et al. |
| 5,349,978 A | 9/1994 | Sago et al. |
| 5,350,454 A * | 9/1994 | Ohkawa .................... 118/723 |
| 5,361,449 A | 11/1994 | Akimoto |
| 5,421,893 A | 6/1995 | Perlov |
| 5,431,421 A | 7/1995 | Thompson et al. |
| 5,445,172 A | 8/1995 | Thompson et al. |
| 5,513,594 A | 5/1996 | McClanahan et al. |
| 5,551,986 A | 9/1996 | Jain |
| 5,562,113 A * | 10/1996 | Thompson et al. ........ 134/95.2 |
| 5,591,262 A | 1/1997 | Sago et al. |
| 5,604,297 A * | 2/1997 | Seiden et al. ................. 73/191 |
| 5,610,683 A * | 3/1997 | Takahashi .................... 355/53 |
| 5,616,069 A | 4/1997 | Walker et al. |
| 5,666,985 A | 9/1997 | Smith, Jr. et al. |
| 5,677,824 A | 10/1997 | Harashima et al. |
| 5,678,116 A | 10/1997 | Sugimoto et al. |
| 5,718,763 A | 2/1998 | Tateyama et al. |
| 5,762,708 A | 6/1998 | Motoda et al. |
| 5,762,751 A | 6/1998 | Bleck et al. |
| 5,779,796 A | 7/1998 | Tomoeda et al. |
| 5,795,399 A * | 8/1998 | Hasegawa et al. ........... 134/1.3 |
| 5,815,762 A | 9/1998 | Sakai et al. |
| 5,845,662 A | 12/1998 | Sumnitsch |
| 5,860,640 A | 1/1999 | Marohl et al. |
| 5,868,855 A * | 2/1999 | Fukazawa et al. ........... 134/1.3 |
| 5,868,866 A | 2/1999 | Maekawa et al. |
| 5,882,433 A | 3/1999 | Ueno |
| 5,885,755 A | 3/1999 | Nakagawa et al. |
| 5,895,550 A * | 4/1999 | Andreas ..................... 156/345 |
| 5,916,366 A | 6/1999 | Ueyama et al. |
| 5,942,035 A | 8/1999 | Hasebe et al. |
| 5,974,689 A * | 11/1999 | Ferrell et al. .................. 34/340 |
| 5,975,098 A * | 11/1999 | Yoshitani et al. ........... 134/148 |
| 5,997,653 A | 12/1999 | Yamasaka |
| 6,007,673 A * | 12/1999 | Kugo et al. ................. 153/345 |
| 6,036,785 A * | 3/2000 | Ferrell ............................ 134/1 |
| 6,042,687 A * | 3/2000 | Singh et al. ................ 156/345 |
| 6,119,366 A * | 9/2000 | Ferrell et al. ................. 34/340 |

* cited by examiner

REACTOR FOR PROCESSING A WORKPIECE USING SONIC ENERGY

This application is a Continuation-In-Part of: U.S. patent application Ser. No. 09/437,711, filed Nov. 10, 1999 and now pending, which is a Continuation-In-Part/U.S. National Phase of International patent application No. PCT/US99/05676, filed Mar. 15, 1999, and now expired; which is a Continuation-In-Part of U.S. patent application Ser. No. 60/116,750 filed Jan. 23, 1999, and now expired. Priority to these applications is claimed and these applications are incorporated herein by reference. This application also incorporates by reference U.S. patent application Ser. Nos. 09/907,484; 09/907,552; and 09/907,522, respectively.

The invention relates to surface preperation, cleaning, rising and drying of workpiece, such as semiconductor wafers, flat panel displays, rigid disk or optical media, thin film heads, or other workpieces form from a substrate on which microelectronic circuits, data storage elements or layers, or micro-mechanical elements may be formed. These and similar articles are collectively reffered to here as a "wafer" or "workpiece".

BACKGROUND OF THE INVENTION

The semiconductor manufacturing industry is constantly seeking to improve the processes used to manufacture microelectronic circuits and components, such as the manufacture of integrated circuits from wafers. The objectives of many of these improved processes are decreasing the amount of time required to process a wafer to form the desired integrated circuits; increasing the yield of usable integrated circuits per wafer by, for example, decreasing contamination of the wafer during processing; reducing the number of steps required to create the desired integrated circuits; and reducing the costs of manufacture.

In the processing of wafers, it is often necessary to subject one or more sides of the wafer to a fluid in either liquid, vapor or gaseous form. Such fluids are used to, for example, etch the wafer surface, clean the wafer surface, dry the wafer surface, passivate the wafer surface, deposit films on the wafer surface, etc. Controlling how the processing fluids are applied to the wafer surfaces, is often important to the success of the processing operations.

Various machines and methods have been used for carrying out these manufacturing processes. However, existing machines have several disadvantages. These disadvantages include relatively large consumption of process chemicals and water. This consumption of process chemicals increases manufacturing costs, which ultimately increases the cost of the final product, such as e.g., computers, cell phones, and virtually all types of consumer, industrial, commercial and military electronic products. In addition, many process chemicals are toxic and require special handling, storage, and disposal methods. These can be costly and difficult, but are necessary for health, safety and environmental reasons. Consequently, reducing consumption of process chemicals has many advantages.

Reducing consumption of water is also beneficial. In many areas, water is becoming increasingly scarce. Due to population growth, there is greater competition for water. Disposing of waste water in environmentally friendly ways has also often become more difficult or costly. Accordingly, reducing water consumption in the manufacturing process is also important.

In many process manufacturing steps, the process chemicals used should be applied evenly onto the wafers, to avoid having too much or too little etching, film removal, etc. Existing machines often are not able to sufficiently uniformly apply process chemicals. This can result in lower yields. Moreover, many existing machines try to compensate for variations in applying process chemicals by using larger amounts of process chemicals. This inefficient use of process chemicals leads to the disadvantages described above. Accordingly, improved machines and methods which provide improved yield, consume less process chemicals and water, and offer better results in performing manufacturing operations, are needed.

Manufacturing semiconductor and similar products on a commercial scale requires a fab or manufacturing facility often costing hundreds of million dollars to build and equip. Operating and maintenance costs are also very high. Consequently, the output or yield of the fab is critical to successful operations. Faster processing can help increase the fab output. While conventional processing with liquids may produce the desired results, it can be time consuming. Accordingly, faster process methods and machines are very advantageous.

SUMMARY OF THE INVENTION

Machines and methods have now been invented which overcome the disadvantages described above. In one design, the machine includes a workpiece housing having a processing chamber. Processing fluids are distributed across the surface of the workpiece in the processing chamber, by centrifugal force.

In a first aspect, a system for processing a workpiece includes a bowl, chamber or recess for holding a liquid. A sonic energy source is associated with the bowl for introducing sonic energy into the liquid in the bowl. A process head lifter is positioned to move at least part of a process head holding a workpiece into and out of the liquid in the bowl. The process head preferably includes an upper element or rotor and a lower element or rotor, with the upper and lower rotors or elements engageable around a workpiece. Where upper and lower rotors are used, the process head also includes a motor or other device or technique for spinning the rotors.

In a second aspect, a sonic transducer, such as a megasonic or ultrasonic transducer is used as the sonic energy source.

In a third aspect, the lower rotor or element is moveable into a position where it substantially surrounds the sonic transducer. The transducer may be fixed in place within the bowl. Alternatively, the transducer may be on or in the upper and/or the lower rotors or elements.

In a fourth aspect, one or more liquid supplies are connected to the bowl. The liquid supplies provide liquids to the bowl, which may include water, HF, and ozonated water, or other cleaning chemistries such as SC1, SC2, Piranha, etc., and a combination of them.

In a fifth aspect, the sonic energy source or transducer has an opening with a liquid outlet nozzle positioned under the opening, with the nozzle positioned to apply a liquid or gas or vapor to a lower surface of the workpiece.

In a sixth aspect, a method for processing a workpiece includes the steps of holding a workpiece between an upper rotor or element and a lower rotor or element, and contacting the workpiece with a bath of liquid. Sonic energy is introduced into the bath of liquid and transmitted through the liquid to the workpiece. The workpiece is then rotated, during and/or after contact with the bath.

The use of sonic energy in these aspects expedites processing and provides more efficient processing. The use of sonic energy with reactors, such as described in International patent application No. WO 99/46064, (published Sep. 16, 1999 and incorporated herein by reference) which are currently in use is counter-intuitive, due to their often closed configuration; spinning rotors; and/or lack of a continuous liquid volume around the workpiece. It has now been discovered, however, that sonic energy can indeed be used in these types of reactors, providing improved processing.

Accordingly, it is an object of the invention to provide improved methods and apparatus for processing a workpiece. The invention resides as well in subcombinations of the steps and features described. The features described and illustrated in connection with one embodiment may or course be used in other embodiments as well.

BRIEF DESCRIPTION OF THE DRAWINGS

In the drawings, the same element number is used to designate the same element in all of the views.

DETAILED DESCRIPTION OF THE INVENTION

Figure 1:
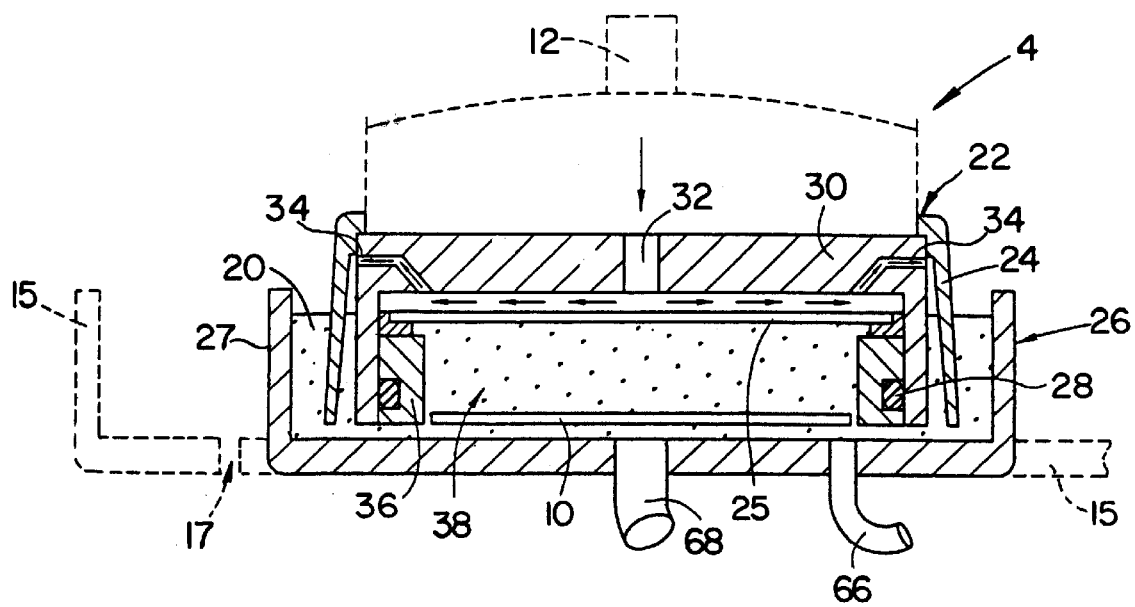
FIG. 1 is a schematic section view of a processing system using sonic energy.

The reactors described in the Applications listed above may also be used with systems and methods including sonic energy, such as megasonic or ultrasonic energy. Referring to FIG. 1, a sonic energy workpiece processing system 4 includes a reactor or process head 22, and a bowl, tank or other liquid holding vessel 26. The bowl 26 preferably includes a fill port 66 and a drain 68, to better facilitate filling and draining the bowl 26. A sonic energy source, such as a megasonic or ultrasonic transducer 10 is provided on or in the bowl 26. A vertical lift actuator 12 lifts and lowers the reactor 22.

Referring still to FIG. 1, the reactor 22 includes an upper rotor 30 engageable with a lower rotor 36. The upper rotor preferably has an inlet or nozzle 32 and outlets 34, as with the reactors referenced above. The lower rotor 36 is preferably ring-shaped, having an open central area 38. This allows direct exposure of the workpiece 25 to the sonic transducer or source 10, through the liquid 20 in the bowl 26.

In use, a wafer or workpiece 25 is placed into the reactor 22. The upper and lower rotors 30 and 36 are moved towards each other to secure the workpiece 25 between them. Liquid 20 is provided into the bowl 26 via the fill port 66 connected to a liquid supply source. The drain 68 is closed, so that the bowl 26 fills with the liquid 20. The lift actuator 12 lowers the reactor 22 into the bowl 26. The reactor is vertically positioned so that at least the bottom surface of the workpiece 25 is in contact with the liquid 20. Optionally, the side edge, or even the top surface of the workpiece 25, may also be in contact with, or immersed in the liquid 20. The liquid may include de-ionized water, include HF, ozonated de-ionized water, or other etching chemistries. The entire system 4 may optionally be contained within an enclosure.

The sonic transducer or sonic energy source 10 is turned on. Sonic energy from the transducer 10 travels through the liquid 20 to the workpiece 25. The workpiece may be stationary or rotating. Rotating the workpiece helps to move particles and material removed from the workpiece surface away from the workpiece. During these steps, the fill port 66 and drain 68 may be closed. However, preferably, the fill port 66 and drain 68 are open during processing, to provide a continuous flow of liquid 20 through the bowl 26. The continuous flow helps to carry away particles and materials removed from the surfaces of the workpiece 25. As shown in dotted lines in FIG. 1, an outer vessel 15 having a drain opening 17 may be provided around the bowl 26. The bowl 26 is filled with liquid and overflows during processing. Liquid flows over sides 27 of the bowl 26 and out of the drain 17. This provides for a uniform flow. The overflow of liquid carries particles or contaminants away from the workpiece.

Figure 2:
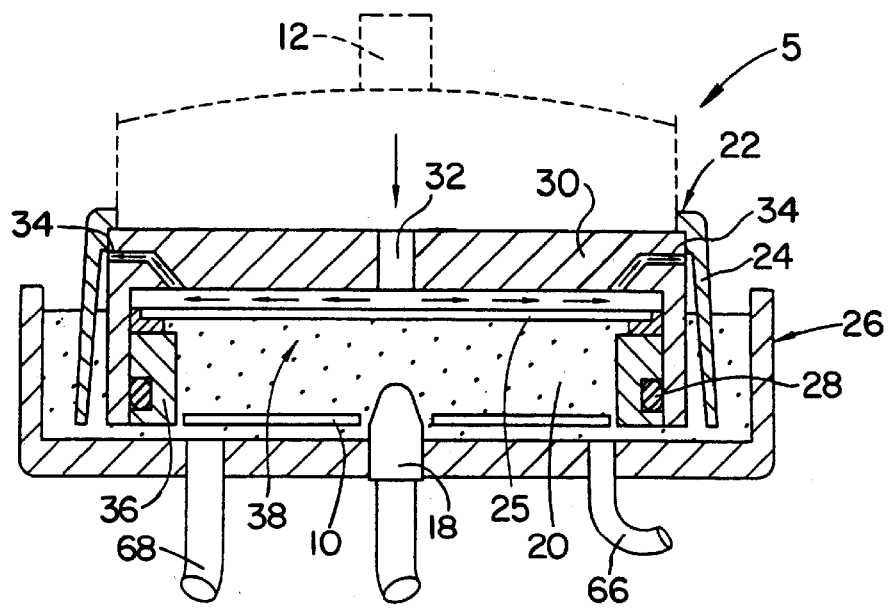
FIG. 2 is a schematic section view of another embodiment of the system shown in FIG. 1.

Referring to FIG. 2, in an alternative sonic energy workpiece processing system 5, a nozzle 18 is positioned in the bowl 26 and extends through an opening in the sonic transducer 10. The nozzle 18 is preferably centered on the spin axis of the workpiece 25. The system 5 operates in the same way as the system 4 described above and shown in FIG. 1. However, in addition, after processing with sonic energy is completed, the fill port 66 is closed and the drain 68 is opened, to drain most or all liquid from the bowl 26. The nozzle 18 then delivers a process fluid onto the lower surface of the workpiece 25, after liquid is removed from the bowl.

Figure 3:
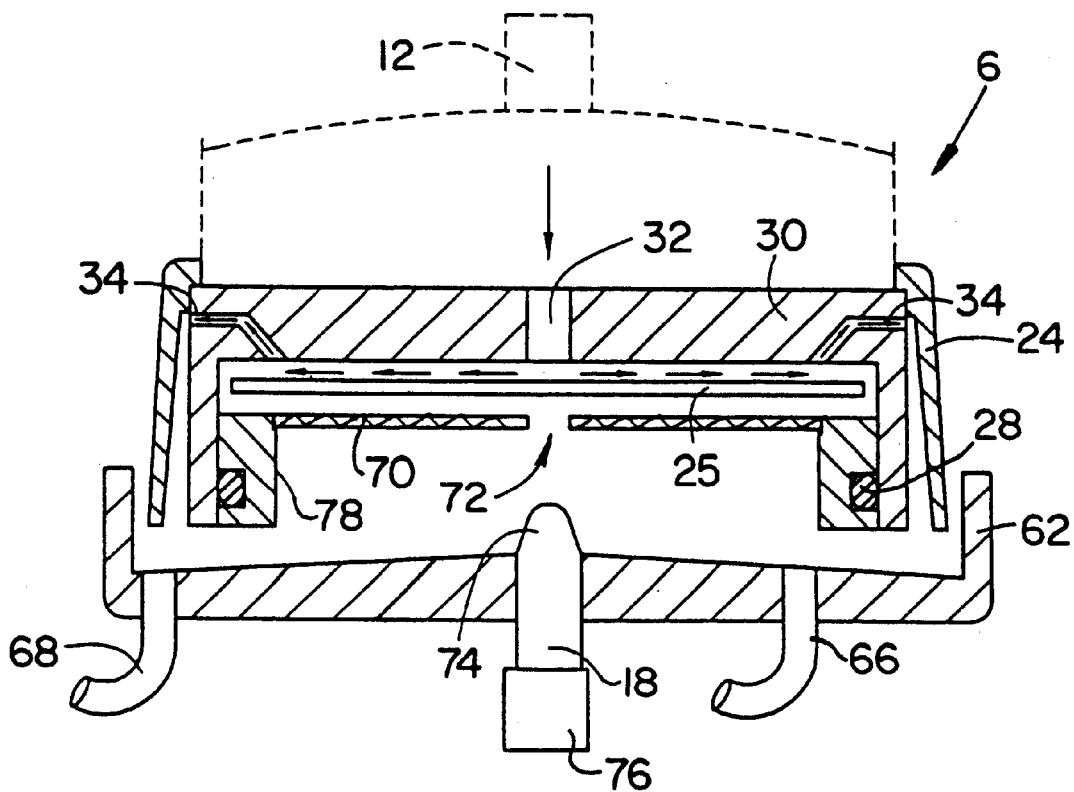
FIG. 3 is a schematic section view of another processing system using sonic energy.

Turning to FIG. 3, in another alternative sonic energy workpiece processing system 6, a nozzle 18 extends through, or up from, a bowl 62. A lower rotor 78 in a reactor or process head includes a sonic transducer 70 having a central opening 72. The opening 72 is aligned with the top end 74 of the nozzle 18, preferably on the axis of rotation of the workpiece 25. The sonic transducer 70 is configured as a generally flat plate or bar contained within or on the lower rotor 78. Electrical connection to the sonic transducer 70 is made through slip rings or similar devices in the reactor.

In use, the system 6 operates in the same way as the systems 4 and 5 described above. However, the sonic transducer 70 is attached to, or part of, the lower rotor 78, and it spins with the rotor. Moreover, the nozzle 18 is supported on a nozzle lifter 76 which can move the nozzle 18 up, so that the top end of the nozzle 18 seals against the transducer 70. Process liquids are delivered into the chamber formed around the workpiece 25, from the upper inlet or nozzle 32, or from the lower nozzle 18, or both. With liquid filling the space between the transducer 70 and workpiece 25, sonic energy from the transducer 70 is transmitted to the workpiece. When processing using sonic energy is completed, the nozzle 18 is withdrawn by reversing the nozzle lifter 76, returning the system 6 to a reactor configuration without sonic energy, similar to those described above.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the inventions. The inventions therefore, should not be limited, except by the following claims, and their equivalents.

What is claimed is:

1. A system for processing a workpiece, comprising:
a bowl for holding a liquid;
a sonic energy source associated with the bowl for introducing sonic energy into a liquid in the bowl;
a process head for holding a workpiece, with the process head having an upper rotor and a lower rotor, with the upper rotor and the lower rotor moveable relative to each other to hold a workpiece between them;
a process head lifter positioned to move at least part of the process head into and out of liquid in the bowl.

2. The system of claim 1 further including a fill port and a drain port in the bowl.

3. The system of claim 1 wherein the lower rotor comprises an annular ring.

4. The system of claim 1 wherein the sonic energy source comprises a sonic transducer.

5. The system of claim 1 wherein the transducer is fixed in place within the bowl.

6. The system of claim 5 wherein the transducer is aligned with the lower rotor.

7. The system of claim 1 further comprising one or more process liquid supply sources connected to the bowl.

8. The system of claim 7 wherein the process liquid supply sources contain an etchant liquid.

9. The system of claim 1 further comprising a motor connected at least indirectly to the upper rotor.

10. A system for processing a workpiece, comprising:
a bowl for holding a liquid;
a sonic energy source associated with the bowl for introducing sonic energy into a liquid in the bowl;
a process head for holding a workpiece,
a process head lifter positioned to move at least part of the process head into and out of liquid in the bowl;
wherein the process head has a lower rotor, including an annular ring which is moveable into a position where it substantially surrounds the sonic energy source.

11. A system for processing a workpiece, comprising: a bowl for holding a liquid;
a sonic transducer associated with the bowl for introducing sonic energy into a liquid in the bowl;
a process head for holding a workpiece,
a process head lifter positioned to move at least part of the process head into and out of liquid in the bowl; and
a liquid outlet nozzle positioned under an opening in the transducer.

12. A system for processing a workpiece, comprising:
a bowl for holding a liquid;
a sonic energy transducer associated with the bowl for introducing sonic energy into a liquid in the bowl;
a process head for holding a workpiece,
a process head lifter positioned to move at least part of the process head into and out of liquid in the bowl; and
a liquid outlet nozzle extending through an opening in the transducer.

13. A system for processing a workpiece comprising:
a base including a recess for holding a liquid;
sonic energy means for providing sonic energy into a liquid in the recess;
a process reactor means including a process head having an upper rotor and a lower rotor, with the upper rotor and the lower rotor moveable relative to each other to hold a workpiece between them; and
lifting means for raising and lowering the process head.

14. A method for processing a workpiece, comprising:
securing the workpiece between first and second rotors by moving the first rotor towards the second rotor;
holding the workpiece in a horizontal orientation within the rotors;
contacting the workpiece with a bath of liquid;
providing sonic energy into the bath of liquid;
rotating the rotors to rotate the workpiece; and
rotating the workpiece while the workpiece is in contact with the bath.

15. The method of claim 14 further comprising the step of separating the workpiece from the bath, before rotating the workpiece.

16. The method of claim 14 further comprising the step of rotating the workpiece while the workpiece is in contact with the bath.

17. The method of claim 14 further comprising the step of contacting the workpiece with the bath by lowering the lower rotor into the bath.

18. The method of claim 14 wherein the bath comprises an etchant.

19. The method of claim 14 wherein the workpiece is held in a horizontal orientation between the first rotor and the second rotor.

20. A method for processing a workpiece, comprising:
holding a workpiece in a horizontal orientation;
contacting the workpiece with a bath of liquid;
providing sonic energy into the bath of liquid; and
rotating the workpiece while the workpiece is in contact with the bath; and
contacting a bottom surface of the workpiece with the bath and causing liquid from the bath to move onto a peripheral edge area of a top surface of the workpiece.

21. A method for processing a workpiece, comprising:
holding a workpiece in a horizontal orientation
contacting the workpiece with a bath of liquid;
providing sonic energy into the bath of liquid; and
rotating the workpiece;
where the workpiece has a top surface and a bottom surface and where the bottom surface of the workpiece is contacted with the bath, further comprising the step of providing a fluid onto the top surface of the workpiece.

22. A system for processing a workpiece, comprising: an upper rotor;
a lower rotor engageable with the upper rotor, to hold a workpiece between them;
a sonic transducer on at least one of the upper and lower rotors;
at least one fluid inlet in at least one of the upper and lower rotors; and
at least one fluid outlet in at least one of the upper and lower rotors.

23. The system of claim 22 further comprising a tank for holding a liquid, and an actuator for lowering the lower rotor into the tank.

24. The system of claim 23 with the sonic transducer having a central through opening, and further comprising a nozzle outlet in the tank aligned with the central through opening.

25. The system of claim 23 further comprising a first process fluid source connected to the tank, and a second process fluid source connected to an outlet in the upper rotor.

26. The system of claim 23 further comprising means for rotating the lower rotor relative to the tank.

27. The system of claim 22 further comprising a spin motor attached to the upper rotor.

28. The system of claim 22 further comprising means for attaching and releasing the upper rotor and the lower rotor.

29. A system for processing a workpiece, comprising:
   a bowl for holding a liquid;
   a sonic energy source associated with the bowl for introducing sonic energy into a liquid in the bowl;
   a process head for holding a workpiece, with the process head having an upper rotor and an annular lower rotor having an open central area, with the upper rotor and the lower rotor moveable relative to each other to hold a workpiece between them, and with the workpiece exposed to the sonic energy source through the open central area; and
   a process head lifter positioned to move at least part of the process head into and out of liquid in the bowl.

* * * * *